(12) United States Patent
Kondo et al.

(10) Patent No.: US 11,639,971 B2
(45) Date of Patent: May 2, 2023

(54) LOAD TESTING DEVICE AND INSULATING FRAME FOR LOAD TESTING DEVICE

(71) Applicant: TATSUMI RYOKI CO., LTD, Tokyo (JP)

(72) Inventors: Toyoshi Kondo, Tokyo (JP); Nobuhide Hamano, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 167 days.

(21) Appl. No.: 17/427,495

(22) PCT Filed: Feb. 13, 2020

(86) PCT No.: PCT/JP2020/005446
§ 371 (c)(1),
(2) Date: Jul. 30, 2021

(87) PCT Pub. No.: WO2020/195286
PCT Pub. Date: Oct. 1, 2020

(65) Prior Publication Data
US 2022/0011376 A1  Jan. 13, 2022

(30) Foreign Application Priority Data

Mar. 25, 2019 (JP) .............................. JP2019-055789
Apr. 5, 2019 (JP) .............................. JP2019-072557
Aug. 6, 2019 (JP) .............................. JP2019-144339

(51) Int. Cl.
*G01R 31/40* (2020.01)
*H05K 7/20* (2006.01)

(52) U.S. Cl.
CPC ......... *G01R 31/40* (2013.01); *H05K 7/20909* (2013.01)

(58) Field of Classification Search
CPC ........ G01R 31/40; G01R 1/203; G01R 31/34; H05K 7/20909; H01C 1/08
(Continued)

(56) References Cited

U.S. PATENT DOCUMENTS 10,976,369 B2 * 4/2021 Kondo ................... G01R 31/40
11,555,861 B2 * 1/2023 Kondo ...................... C01B 3/00
(Continued)

FOREIGN PATENT DOCUMENTS

JP     S48-17954 U1   2/1973
JP     S62-151715 U1  9/1987
(Continued)

OTHER PUBLICATIONS

Office Action issued in Japanese Patent Application No. 2020-155971 dated Aug. 4, 2021, with English Translation (7 pages).
(Continued)

*Primary Examiner* — Giovanni Astacio-Oquendo
(74) *Attorney, Agent, or Firm* — Nakanishi IP Associates, LLC

(57) ABSTRACT

A load testing device or the like having a structure in which cooling air does not leak, is provided. A load testing device includes: a resistance unit having a resistor and a resistor holding frame holding the resistor; a cooling unit having a cooling fan; and an insulating frame disposed between the resistance unit and the cooling unit. The insulating frame is coupled with the resistance unit. The insulating frame is coupled with the cooling unit. The insulating frame covers a side surface of a flow path of cooling air from the cooling unit to the resistance unit between the cooling unit and the resistance unit.

13 Claims, 15 Drawing Sheets

(58) Field of Classification Search
USPC .................................... 324/764.01, 537, 500
See application file for complete search history.

(56) References Cited

U.S. PATENT DOCUMENTS

| 11,598,820 B2 * | 3/2023 | Kondo ................... G01R 31/42 |
| 2016/0252579 A1 | 9/2016 | Kondo |
| 2016/0299198 A1 | 10/2016 | Kondo |

FOREIGN PATENT DOCUMENTS

| JP | 2000-19231 A | 1/2000 |
| JP | 2004-363246 A | 12/2004 |
| JP | 2010-25752 A | 2/2010 |
| WO | 2015/125182 A1 | 8/2015 |
| WO | 2018/225152 A1 | 12/2018 |

OTHER PUBLICATIONS

Extended European Search Report issued in European Patent Application No. 20778644.3, dated Nov. 21, 2022 (9 pages).
International Search Report issued in PCT/JP2020/005446 dated Mar. 24, 2020 with English Translation (7 pages).
Written Opinion of International Searching Authority (WOSA) issued in PCT/JP2020/005446 dated Mar. 24, 2020 with English Translation (9 pages).

* cited by examiner

LOAD TESTING DEVICE AND INSULATING FRAME FOR LOAD TESTING DEVICE

TECHNICAL FIELD

The present invention relates to a load testing device and the like.

BACKGROUND ART

Conventionally, a load testing device including a plurality of resistor groups has been proposed as in Patent Literature 1.

CITATION LIST

Patent Literature

Patent Literature 1: JP 2010-25752 A

SUMMARY OF INVENTION

Technical Problem

However, a plurality of insulators is provided between the cooling unit and the resistance unit, and there has been a problem that cooling air leaks from between the insulators.

Therefore, an object of the present invention is to provide a load testing device or the like having a structure in which cooling air does not leak.

Solution to Problem

A load testing device according to the present invention includes: a resistance unit having a resistor and a resistor holding frame holding the resistor; a cooling unit having a cooling fan; and an insulating frame disposed between the resistance unit and the cooling unit. The insulating frame is coupled with the resistance unit. The insulating frame is coupled with the cooling unit. The insulating frame covers a side surface of a flow path of cooling air from the cooling unit to the resistance unit between the cooling unit and the resistance unit.

The insulating frame plays a role of an insulator provided between the cooling unit and the resistance unit.

By providing the insulating frame, it is possible to prevent cooling air from leaking from between the cooling unit and the resistance unit.

The insulating frame can also play a role of a cooling air guide hood provided between the cooling unit and the resistance unit.

Preferably, surfaces of an outer wall and an inner wall of the insulating frame are formed in a pleated shape.

By forming in a pleated shape on the surface of the outer wall and the inner wall of the side portion constituting the insulating frame, it is possible to elongate the insulating distance to enhance the insulating property, compared with a form in which they are not formed in a pleated shape.

More preferably, the insulating frame is composed of two or more members.

In the case where the insulating frame is composed of two or more members, it is possible to form each member more easily, compared with a form in which the insulating frame is configured integrally.

More preferably, at least one of two or more members of the insulating frame has a hole extending in a longitudinal direction.

By providing the hole extending in the longitudinal direction of each member constituting the insulating frame, such as a through hole, a hollow portion is formed inside the insulating frame.

This allows the insulating frame to be lightweight as compared with a form in which the hollow portion is not formed.

Preferably, two or more members of the insulating frame are coupled by fitting.

Fitting allows the insulating frame to be easily assembled from two or more members.

Preferably, in the insulating frame, an intake surface on the side near the cooling unit and an exhaust surface on the side near the resistance unit are open, and the insulating frame has a side portion composed of a front surface portion, a back surface portion, a right side surface portion, and a left side surface portion. The upper surface of the side portion is coupled to the resistance unit. The lower surface of the side portion is coupled to the cooling unit. Surfaces of an outer wall and an inner wall of the side portion are formed in a pleated shape.

Preferably, the insulating frame is mounted on the cooling unit. The resistance unit is mounted on the insulating frame.

Preferably, an air filter including a pleated filter medium is provided at an intake port of the cooling unit.

The air filter can prevent impurities from being contained in the air introduced into the cooling fan.

Since the surface area is increased due to the uneven shape, it is possible to perform intake while removing more impurities as compared with an air filter including a planar filter medium.

Preferably, a spacer composed of an insulating member and protruding outward from the resistor holding frame is provided.

In the case of not providing the spacer, there is a risk that at least one of the resistor holding frame of the resistance unit and a terminal (portion protruding from the resistor holding frame) of the resistor comes into contact with the outside of the load testing device such as the ground. By providing the spacer, it is possible to reduce the possibility that the resistor holding frame of the resistance unit and the terminal of the resistor come into contact with the outside such as the ground.

Preferably, a frame body covering the side surface of the resistor holding frame is provided. A spacer composed of an insulating member is provided between the resistor holding frame and the frame body.

In a case of not providing the frame body, at least one of the resistor holding frame and the terminal of the resistor is exposed to the outside, and hence there has been a risk that dust or the like adheres to the terminal or the like. By providing the frame body, it is possible to reduce the possibility that dust adheres to the resistor holding frame and the terminal of the resistor.

Preferably, the load testing device is housed in a mobile rack.

By housing the load testing device 1 into the mobile rack 800, the load testing device 1 can be easily moved to a transport device such as a truck.

The insulating frame of the load testing device according to the present invention is disposed between a resistance unit and a cooling unit. The resistance unit has a resistor and a resistor holding frame that holds the resistor. The cooling unit has a cooling fan. The insulating frame is coupled with the resistance unit. The insulating frame is coupled with the cooling unit. The insulating frame covers a side surface of a flow path of cooling air from the cooling unit to the resistance unit between the cooling unit and the resistance unit.

The load testing device according to the present invention includes a first resistance unit having a first resistor and a first resistor holding frame that holds the first resistor. The load testing device includes a second resistance unit that is disposed farther from the cooling unit than the first resistance unit is and that has a second resistor and a second resistor holding frame that holds the second resistor. The load testing device includes a cooling unit having a cooling fan. The load testing device includes the insulating frame which includes at least one of a first insulating frame and a second insulating frame. The first insulating frame is coupled to the first resistance unit, is coupled to the cooling unit, and covers the side surface of the flow path of cooling air from the cooling unit to the first resistance unit between the cooling unit and the first resistance unit. The second insulating frame is coupled to the second resistance unit, is coupled to the first resistance unit, and covers the side surface of the flow path of cooling air from the first resistance unit to the second resistance unit between the first resistance unit and the second resistance unit.

Advantageous Effects of Invention

As described above, according to the present invention, it is possible to provide a load testing device or the like having a structure in which cooling air does not leak.

DESCRIPTION OF EMBODIMENTS

The present embodiment will be described below with reference to the drawings.

Note that the embodiment is not limited to the following embodiments. The contents described in one embodiment are applied similarly to other embodiments in principle. Each embodiment and each variation can be combined as appropriate.

Note that in FIGS. 1 and 12 to 15, a cooling fan 15 that is hidden in the casing of a cooling unit 10 and not seen is indicated by a dotted line.

Figure 13:
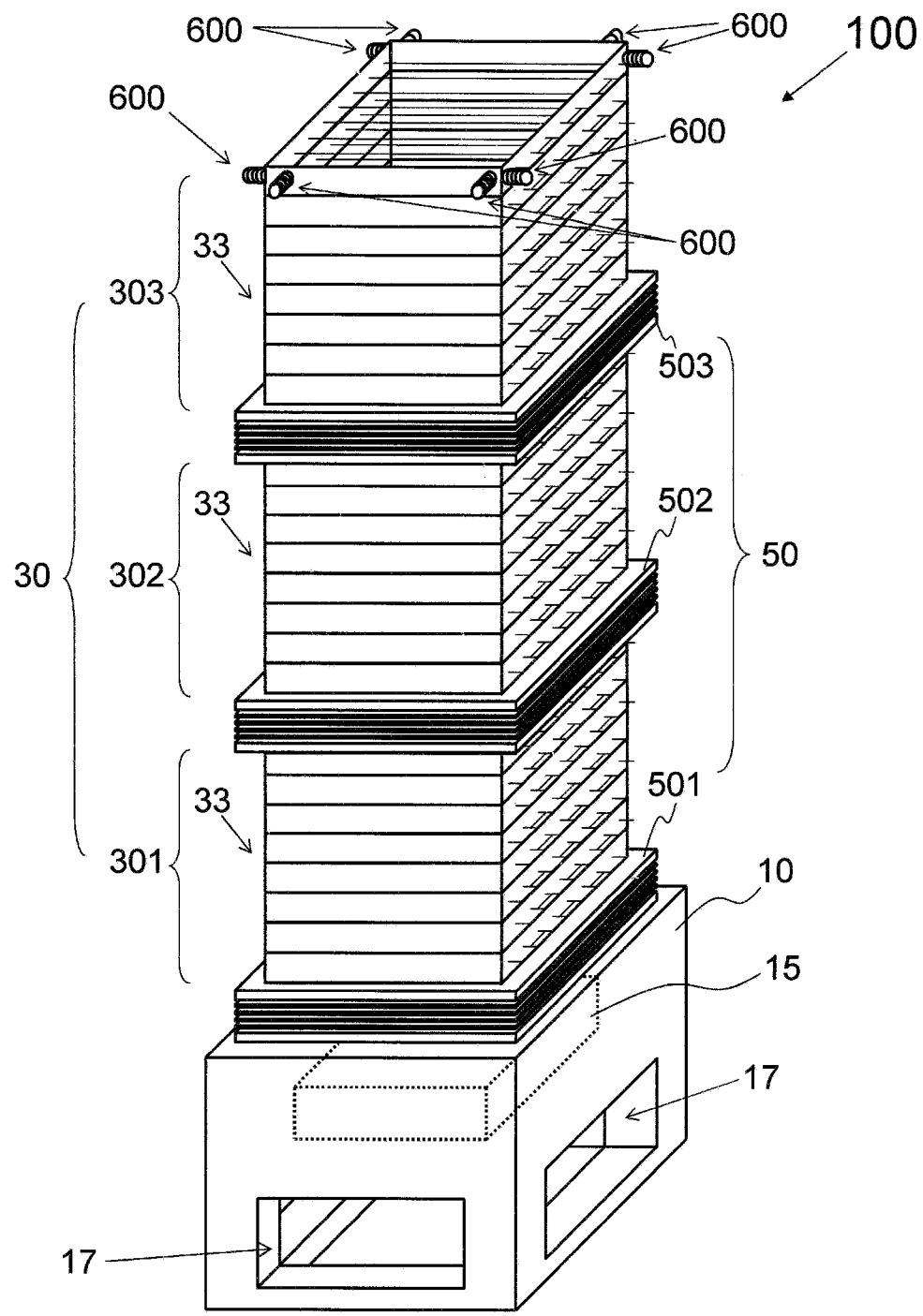
FIG. 13 is a perspective view of the load testing device of FIG. 11 provided with a spacer.
Figure 14:
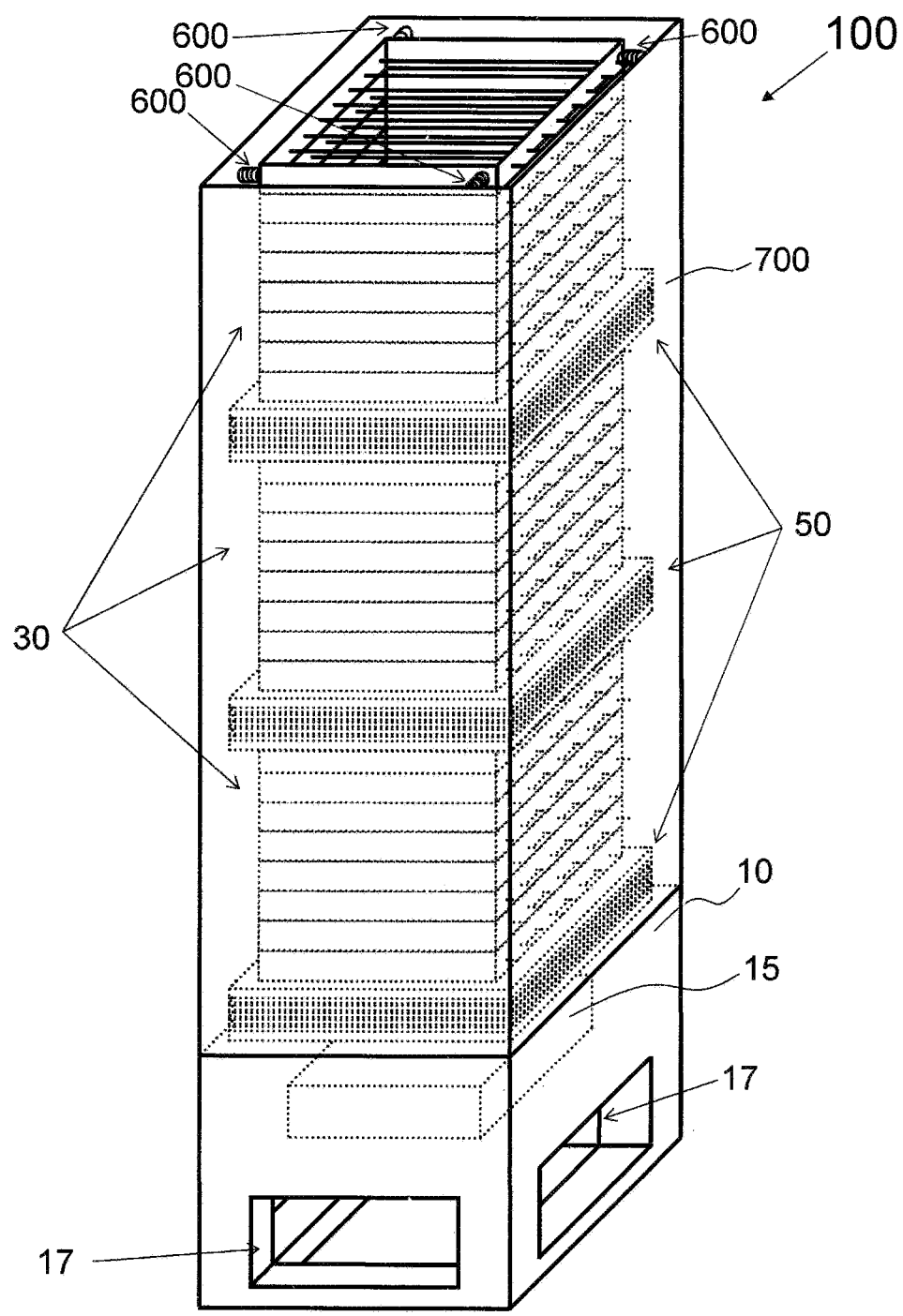
FIG. 14 is a perspective view of the load testing device of FIG. 11 provided with a spacer and a frame body.
Figure 15:
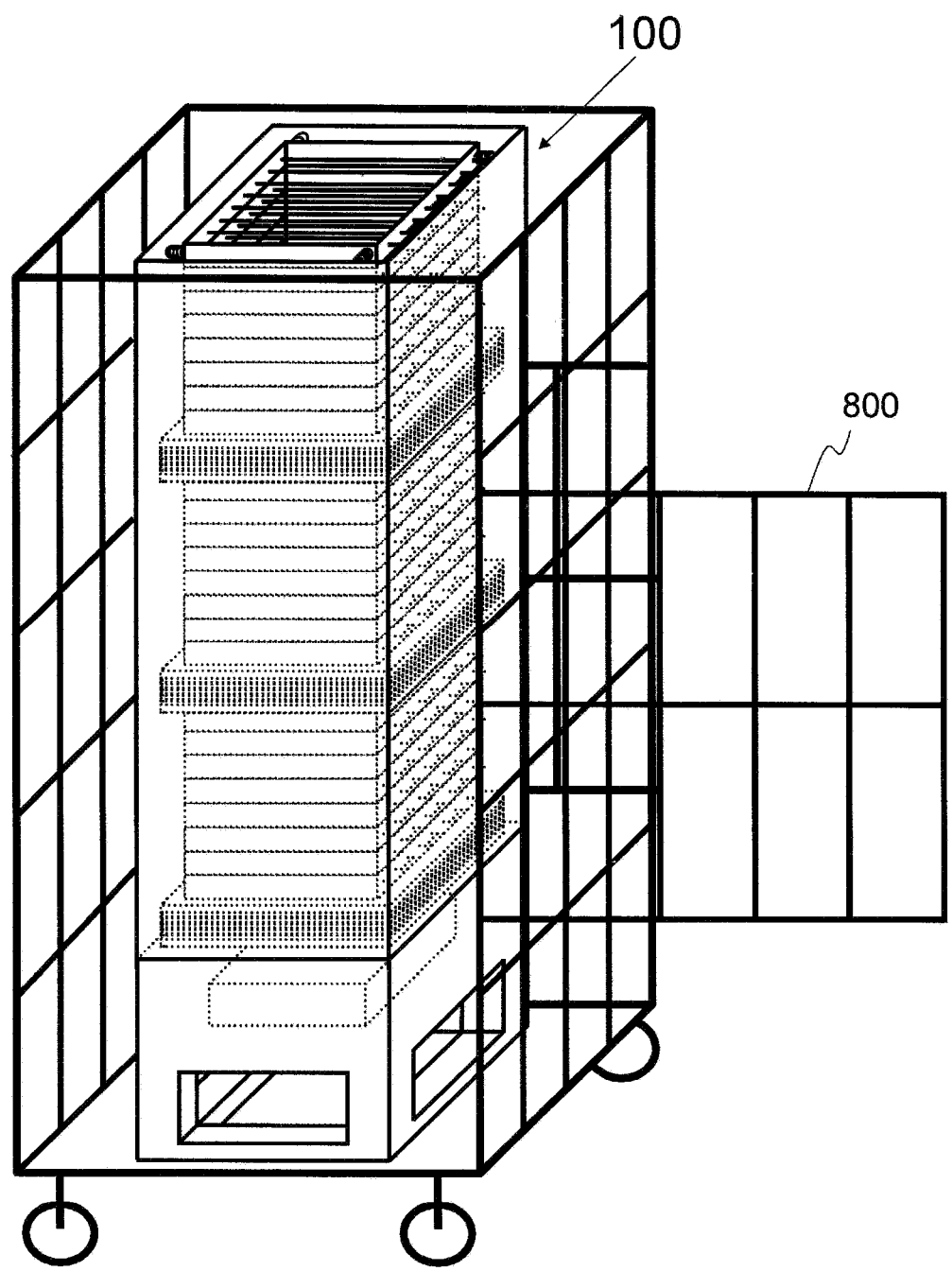
FIG. 15 is a perspective view of a mobile rack housing the load testing device of FIG. 14.

In FIGS. 13 to 15, a resistance unit 30 and an insulating frame 50 that are hidden by a frame body 700 and not seen are indicated by dotted lines.

Figure 1:
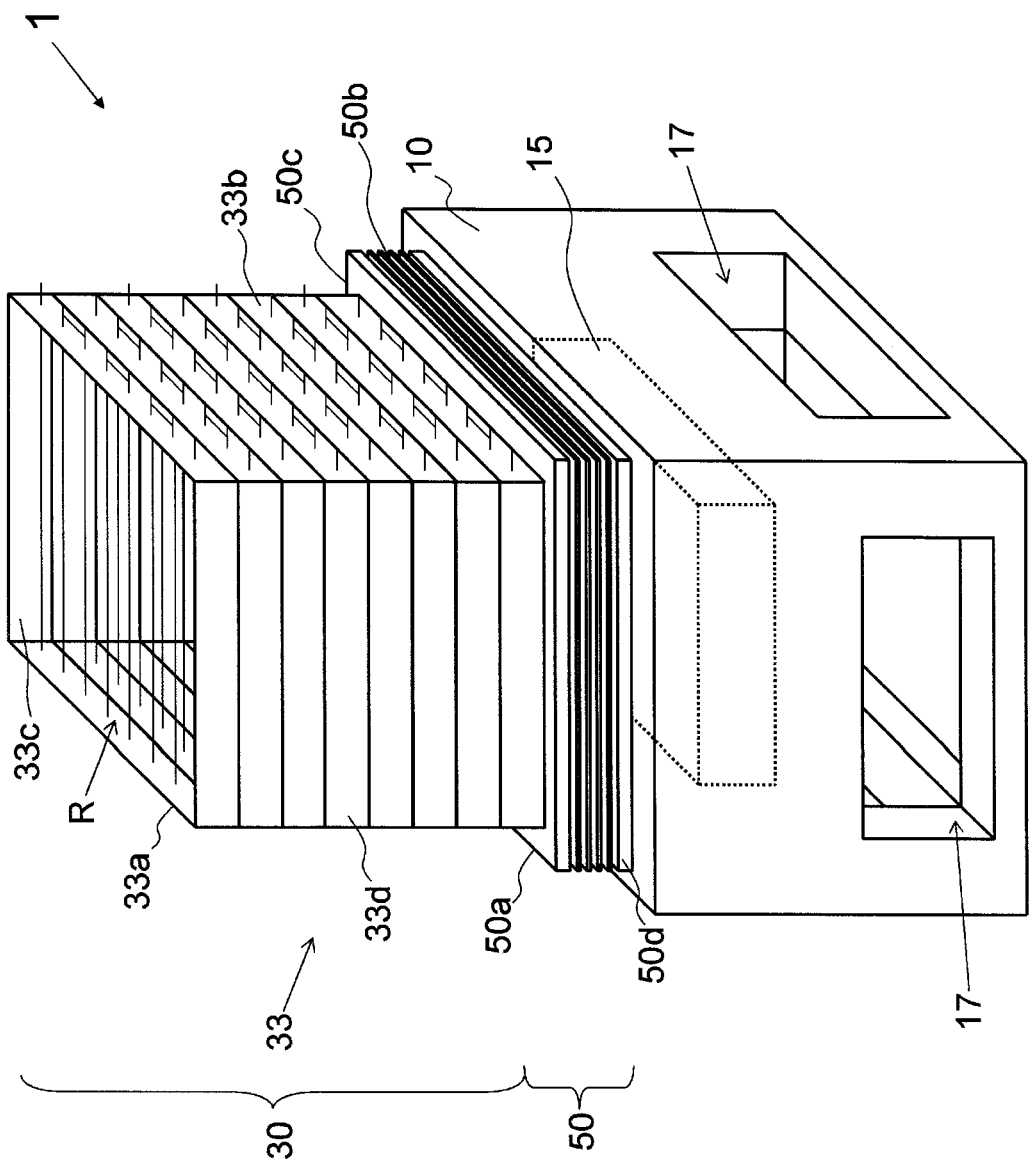
FIG. 1 is a perspective view showing a configuration of a load testing device according to the present embodiment.

A dry load testing device 1 in the present embodiment includes the cooling unit 10, the resistance unit 30, and the insulating frame 50, and is used to conduct a load test of a power source device (test target power source) (see FIG. 1).

(Cooling Unit 10)

The cooling unit 10 is a device that sends cooling air to the resistance unit 30, and has the cooling fan 15 on the side near the resistance unit 30 and an intake port 17 on the side away from the resistance unit 30.

In the present embodiment, the cooling unit 10 is disposed below the resistance unit 30, but the cooling unit 10 and the resistance unit 30 may be disposed side by side in the horizontal direction.

The cooling fan 15 sends air sucked from the intake port 17 to the resistance unit 30.

(Resistance Unit 30)

The resistance unit 30 has a plurality of resistors R and a resistor holding frame 33 that holds the resistors R.

The resistor R is a horizontally extending rod-like resistor.

The plurality of resistors R is aligned at predetermined intervals and connected in series or in parallel to form a resistor group.

The resistance unit 30 is provided with one or more resistor groups, and when in a load test, power from the test target power source is supplied to some or all of said resistor groups.

The resistor holding frame 33 has a substantially hollow rectangular parallelepiped shape.

In the substantially hollow rectangular parallelepiped shape constituting the resistor holding frame 33, an intake surface (lower surface) on the side near the cooling unit 10 and an exhaust surface (upper surface) on the side away from the cooling unit 10 are open, and the substantially hollow rectangular parallelepiped shape has a first front surface portion 33a, a first back surface portion 33b, a first right side surface portion 33c, and a first left side surface portion 33d.

The side portions (first front surface portion 33a and first back surface portion 33b) of the resistor holding frame 33 surround the central portion (resistance element part) of each resistor R and hold the end portion of the resistor R.

(Insulating Frame 50)

The insulating frame 50 is disposed between the cooling unit 10 and the resistance unit 30 and is provided for maintaining a separation between the cooling unit 10 and the resistance unit 30.

The insulating frame 50 is coupled with the cooling unit 10 on the side near the cooling unit 10 (lower part), and is coupled with the resistance unit 30 on the side near the resistance unit 30 (upper part).

The insulating frame 50 is made of a material having electric resistance and heat resistance such as ceramics, epoxy resin, and glass fiber.

The insulating frame 50 has a substantially hollow rectangular parallelepiped shape.

In the substantially hollow rectangular parallelepiped shape constituting the insulating frame 50, an intake surface (lower surface) on the side near the cooling unit 10 and an exhaust surface (upper surface) on the side away from the cooling unit 10, i.e., on the side near the resistance unit 30, are open, and the substantially hollow rectangular parallelepiped shape has a side portion composed of a second front surface portion 50a, a second back surface portion 50b, a second right side surface portion 50c, and a second left side surface portion 50d.

The side portion constituting the insulating frame 50 covers the side surface of the flow path of cooling air from the cooling unit 10 to the resistance unit 30, between the cooling unit 10 and the resistance unit 30.

It is desirable that surfaces of the outer wall and the inner wall of the side portion constituting the insulating frame 50 are formed in a pleated shape.

Figure 2:
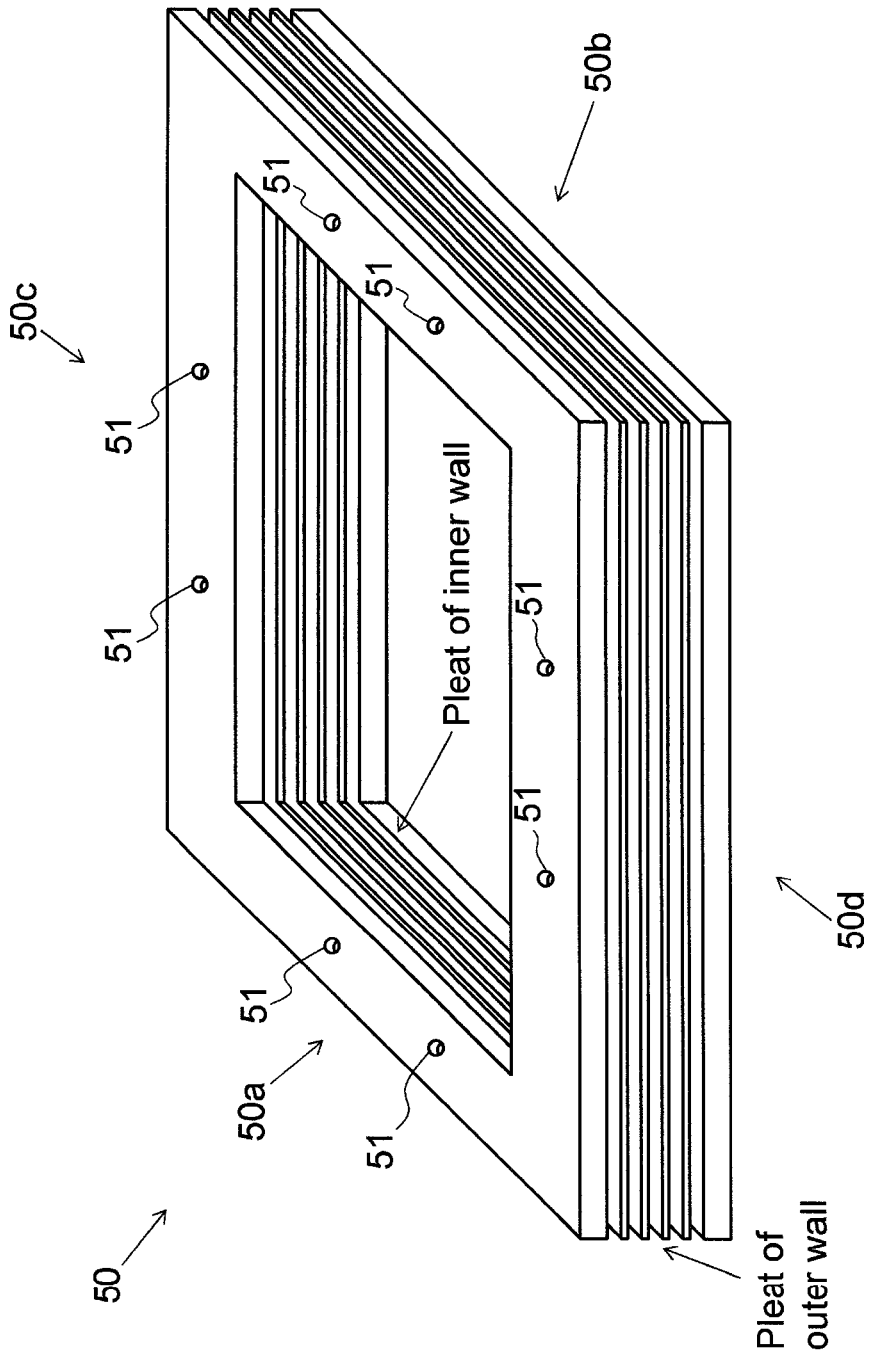
FIG. 2 is a perspective view of an integrally configured insulating frame.

That is, surfaces of the outer wall and the inner wall constituting the side surface of the second front surface portion 50a, surfaces of the outer wall and the inner wall constituting the side surface of the second back surface portion 50b, surfaces of the outer wall and the inner wall constituting the side surface of the second right side surface portion 50c, and surfaces of the outer wall and the inner wall constituting the side surface of the second left side surface portion 50d are formed in a pleated shape (see FIG. 2).

Mounting holes 51 are provided on the upper surface (surface facing the resistance unit 30) and the lower surface (surface facing the cooling unit 10) of the side portion of the insulating frame 50.

That is, the mounting holes 51 are provided on the upper surface and the lower surface of the second front surface portion 50a, the upper surface and the lower surface of the second back surface portion 50b, the upper surface and the lower surface of the second right side surface portion 50c, and the upper surface and the lower surface of the second left side surface portion 50d.

Figure 3:
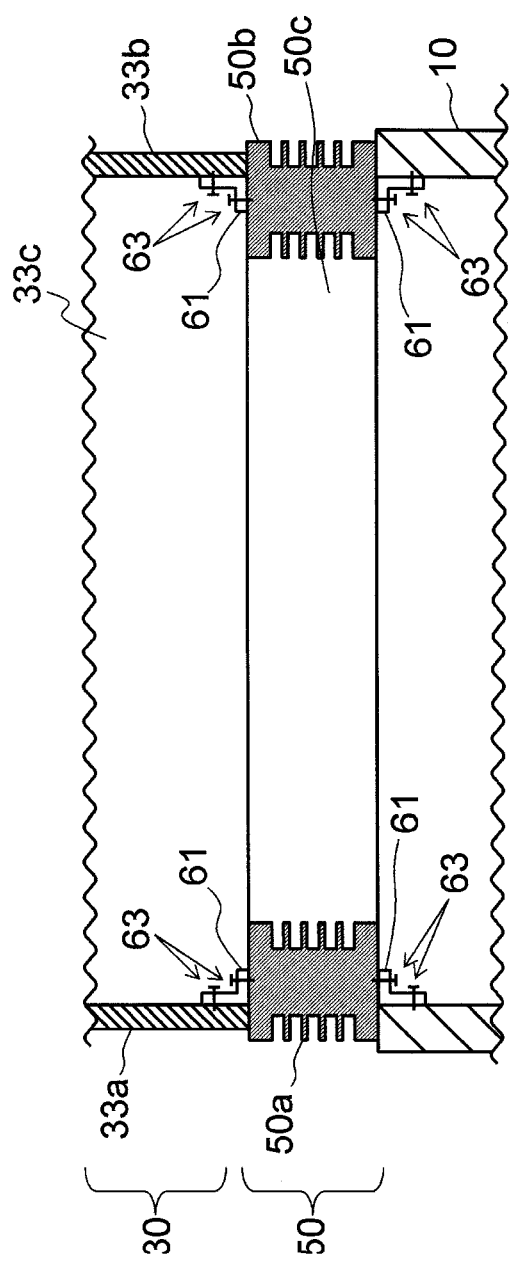
FIG. 3 is a cross-sectional configuration view including a mounting bracket mounted on an inner wall, the integrally configured insulating frame, and a part of the resistance unit and the cooling unit.

The insulating frame 50 is coupled with the resistor holding frame 33 at the upper part via a mounting member such as an L-shaped mounting bracket 61 and a screw 63 (see FIG. 3).

The insulating frame 50 is coupled with the casing of the cooling unit 10 at the lower part via a mounting member such as the L-shaped mounting bracket 61 and the screw 63.

Figure 10:
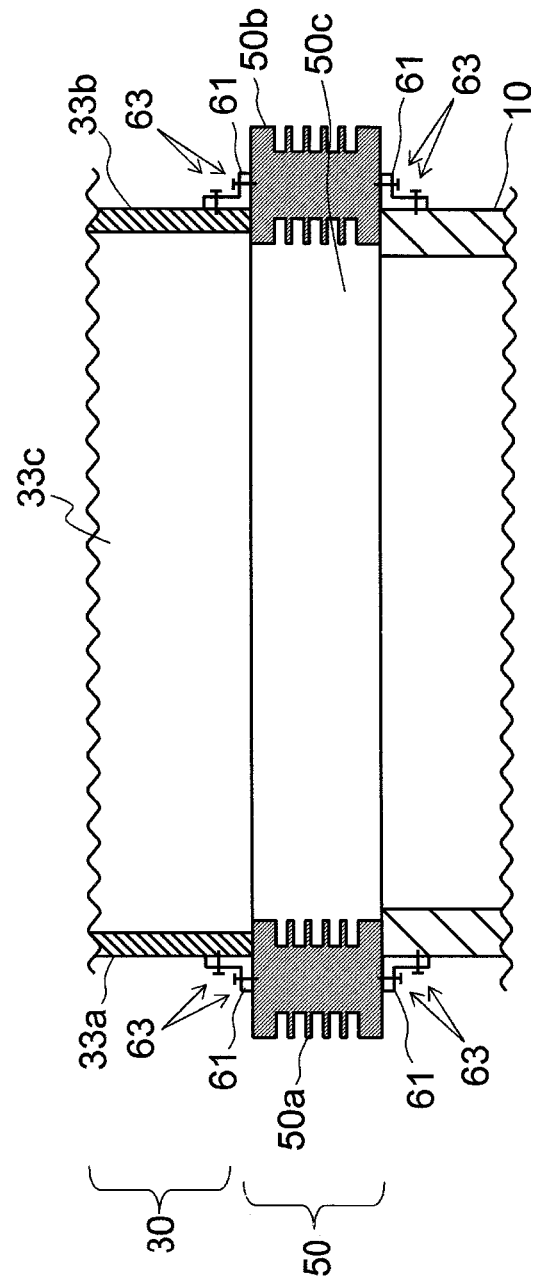
FIG. 10 is a cross-sectional configuration view including a mounting bracket mounted on an outer wall, the integrally configured insulating frame, and a part of the resistance unit and the cooling unit.

FIG. 3 shows an example in which the upper mounting bracket 61 is mounted inside (inner wall) of the resistor holding frame 33, but the upper mounting bracket 61 may be mounted outside (outer wall) of the resistor holding frame 33 (see FIG. 10). Similarly, FIG. 3 shows an example in which the lower mounting bracket 61 is mounted inside (inner wall) of the casing of the cooling unit 10, but as shown in FIG. 10, the lower mounting bracket 61 may be mounted outside (outer wall) of the casing of the cooling unit 10.

The insulating frame 50 may have a form in which the members (second front surface portion 50a, second back surface portion 50b, second right side surface portion 50c, and second left side surface portion 50d) constituting the side portion are integrally configured, or may have a form in which said members are composed of two or more members.

FIGS. 1 to 3 show an example in which the members constituting the side portion of the insulating frame 50 (second front surface portion 50a, second back surface portion 50b, second right side surface portion 50c, and second left side surface portion 50d) are integrally configured.

Figure 4:
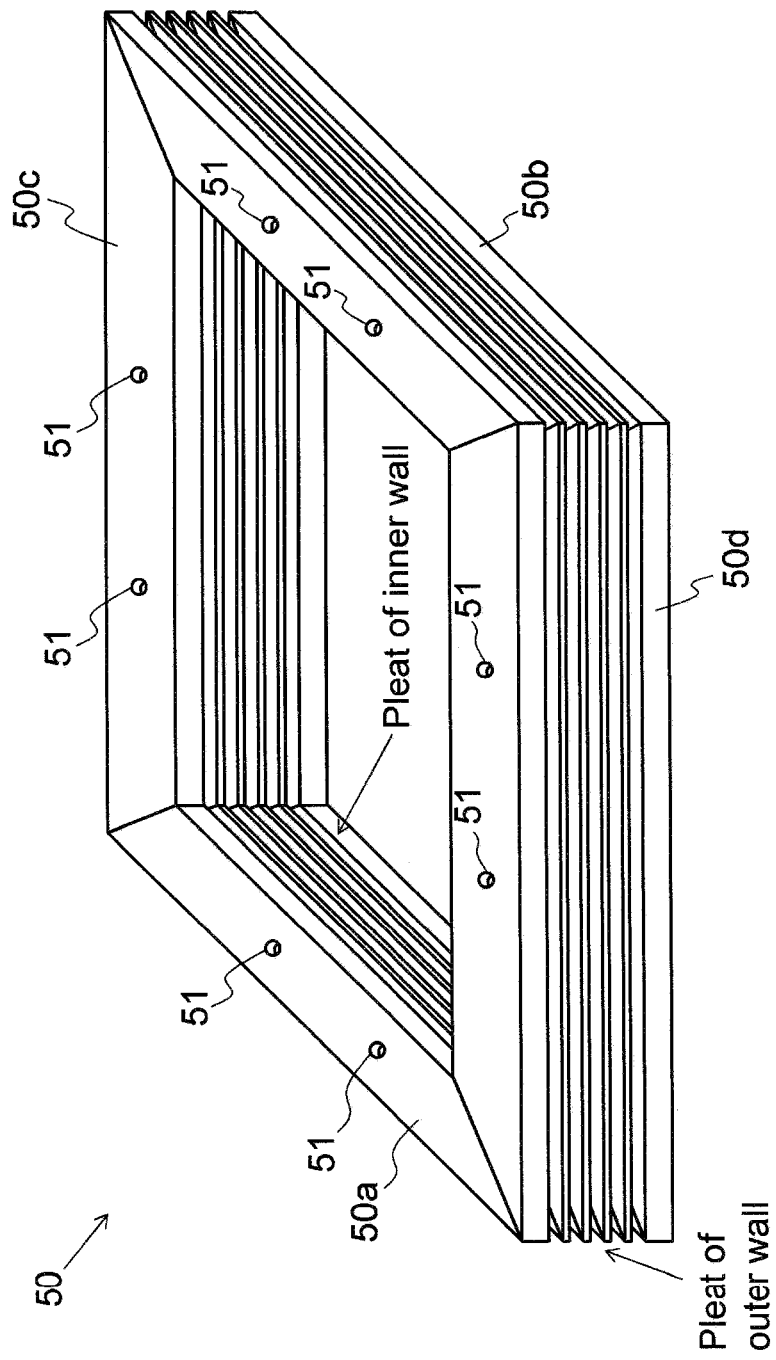
FIG. 4 is a perspective view of a separately configured insulating frame.
Figure 5:
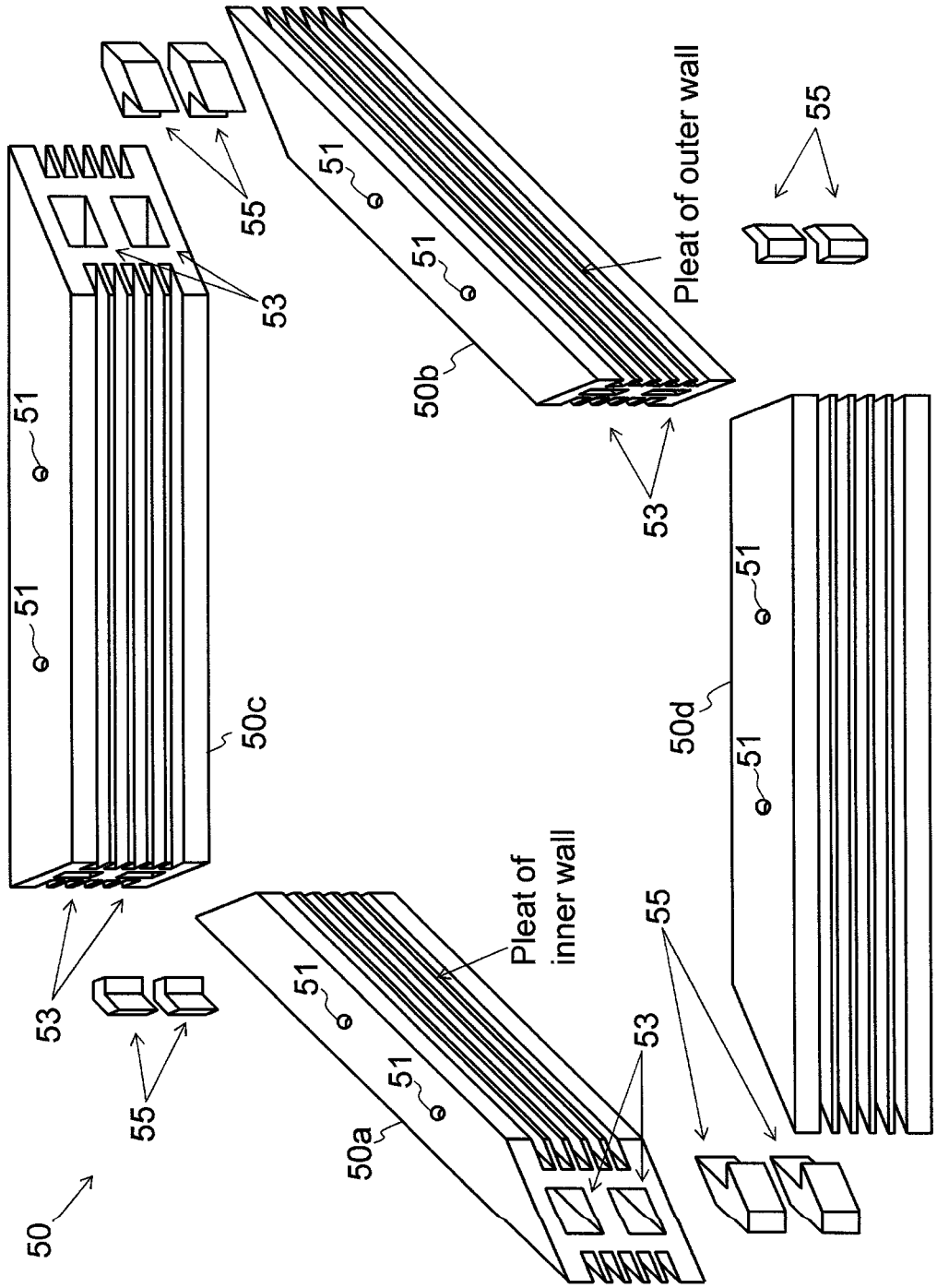
FIG. 5 is an exploded perspective view of the separately configured insulating frame.
Figure 6:
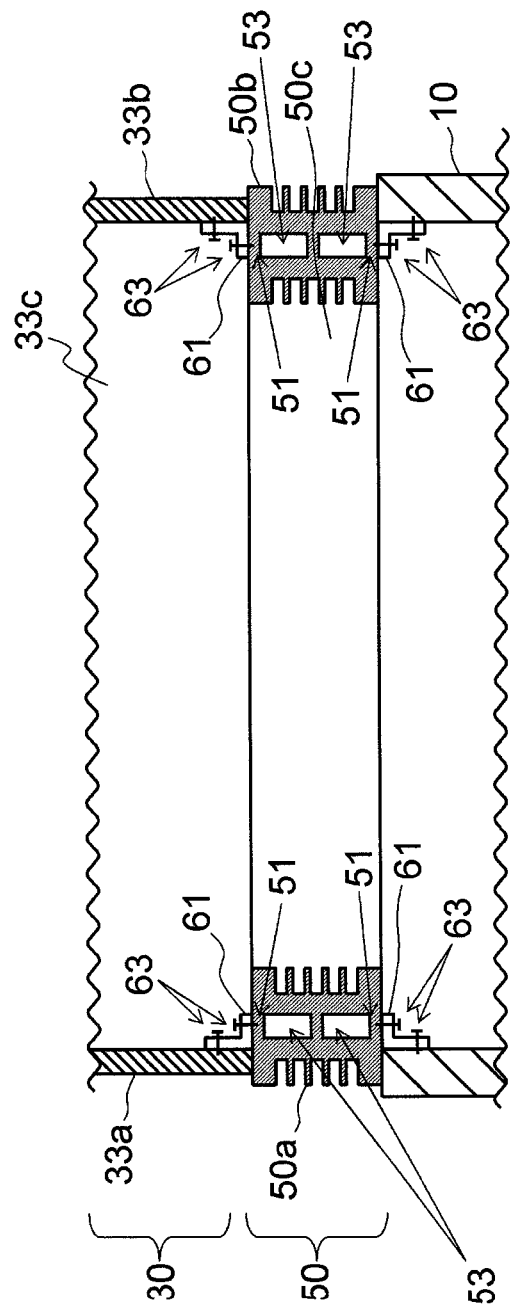
FIG. 6 is a cross-sectional configuration view including the mounting bracket mounted on the inner wall, the separately configured insulating frame, and a part of the resistance unit and the cooling unit.

FIGS. 4 to 6 show an example in which the members constituting the side portion of the insulating frame 50 (second front surface portion 50a, second back surface portion 50b, second right side surface portion 50c, and second left side surface portion 50d) are separately configured.

For example, in the examples shown in FIGS. 4 to 6, each of the second front surface portion 50a, the second back surface portion 50b, the second right side surface portion 50c, and the second left side surface portion 50d has a substantially isosceles trapezoid column shape of the same size.

Note that the side portion of the insulating frame 50 is not limited to the form in which side portion is composed of four members.

For example, the side portion of the insulating frame 50 may be composed of two members, one in which the second front surface portion 50a and the second right side surface portion 50c are integrated, and the other in which the second back surface portion 50b and the second left side surface portion 50d are integrated.

In the case where the insulating frame 50 is composed of two or more members, a hollow portion is provided inside the insulating frame 50 to reduce the weight.

In the example shown in FIGS. 4 to 6, it is shown an example in which two through holes 53 penetrating in the longitudinal direction are provided at the up and down of each of the second front surface portion 50a, the second back surface portion 50b, the second right side surface portion 50c, and the second left side surface portion 50d.

However, the hollow portion provided inside the insulating frame 50 is not limited to the through hole 53, and may be composed of a hole extending in the longitudinal direction.

The second front surface portion 50a, the second back surface portion 50b, the second right side surface portion 50c, and the second left side surface portion 50d, which are separately configured, are preferably coupled by fitting or the like via a coupling member or the like.

In the example shown in FIGS. 4 to 6, the second front surface portion 50a, the second back surface portion 50b, the second right side surface portion 50c, and the second left side surface portion 50d are coupled via substantially L-shaped couplers 55 that can be fitted into the through holes 53.

However, the coupling member is not limited to the coupler 55 shown in FIGS. 4 to 6, and may have another form.

Figure 7:
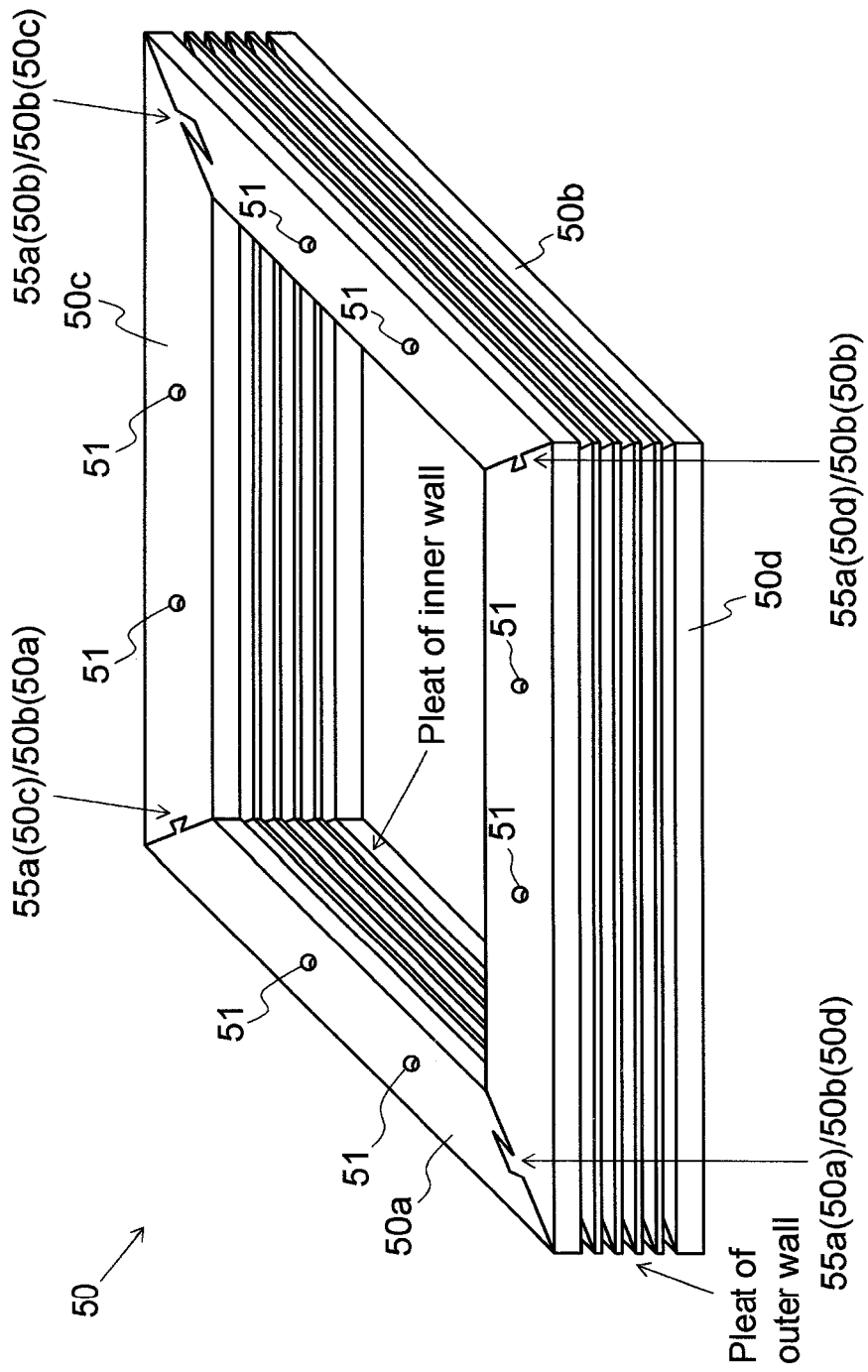
FIG. 7 is a perspective view of the separately configured insulating frame provided with a concave portion and a convex portion at a coupling region.
Figure 8:
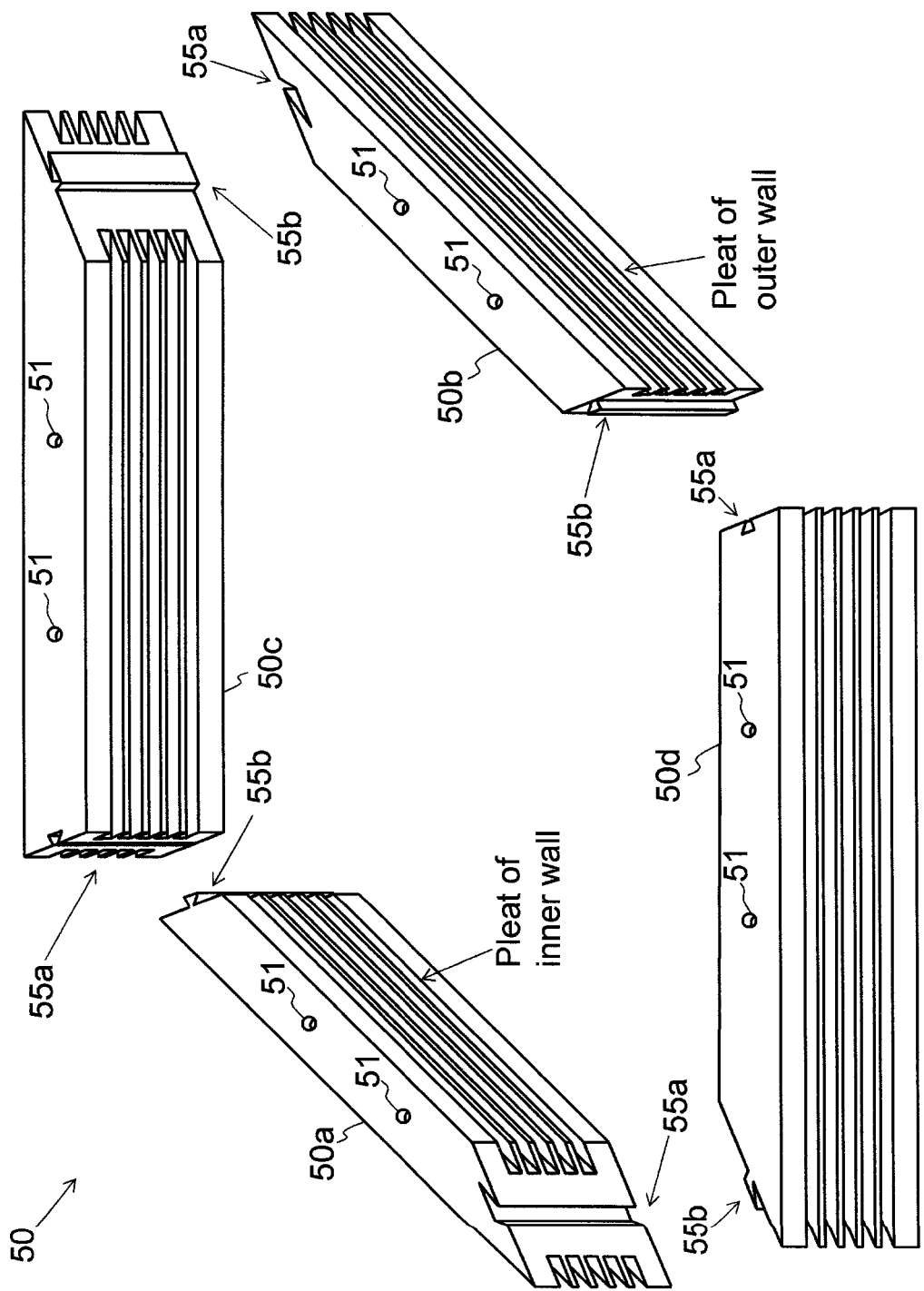
FIG. 8 is an exploded perspective view of the separately configured insulating frame provided with the concave portion and the convex portion at the coupling region.

For example, it is conceivable that a concave portion 55a or a convex portion 55b which can be fitted into the concave portion 55a is provided at a coupling region in each of the second front surface portion 50a, the second back surface portion 50*b*, the second right side surface portion 50*c*, and the second left side surface portion 50*d* (see FIGS. 7 and 8).

In the example shown in FIGS. 7 and 8, it is shown an example in which the second front surface portion 50*a*, the second back surface portion 50*b*, the second right side surface portion 50*c*, and the second left side surface portion 50*d* each have, in the coupling region, the concave portion 55*a* and the convex portion 55*b* which are in a dovetail groove shape.

Specifically, the concave portion 55*a* is provided at the coupling region of the second front surface portion 50*a* with the second left side surface portion 50*d*, and the convex portion 55*b* is provided at the coupling region of the second front surface portion 50*a* with the second right side surface portion 50*c*. The concave portion 55*a* is provided at the coupling region of the second back surface portion 50*b* with the second right side surface portion 50*c*, and the convex portion 55*b* is provided at the coupling region of the second back surface portion 50*b* with the second left side surface portion 50*d*. The concave portion 55*a* is provided at the coupling region of the second right side surface portion 50*c* with the second front surface portion 50*a*, and the convex portion 55*b* is provided at the coupling region of the second right side surface portion 50*c* with the second back surface portion 50*b*. The concave portion 55*a* is provided at the coupling region of the second left side surface portion 50*d* with the second back surface portion 50*b*, and the convex portion 55*b* is provided at the coupling region of the second left side surface portion 50*d* with the second front surface portion 50*a*.

Note that although not illustrated in the examples shown in FIGS. 7 and 8, the through hole 53 may also be provided in this case.

Each of the second front surface portion 50*a*, the second back surface portion 50*b*, the second right side surface portion 50*c*, and the second left side surface portion 50*d* is coupled with the casing of the cooling unit 10 and the resistor holding frame 33 of the resistance unit 30 via the mounting members such as the L-shaped mounting bracket 61 and the screw 63. Therefore, the second front surface portion 50*a*, the second back surface portion 50*b*, the second right side surface portion 50*c*, and the second left side surface portion 50*d* may not be coupled.

In the present embodiment, the insulating frame 50 plays a role of an insulator normally provided between the cooling unit 10 and the resistance unit 30.

Since one insulating frame 50 is provided between the cooling unit 10 and the resistance unit 30, assembly can be simplified and strength can be enhanced, compared with a form in which a plurality of insulators is provided between the cooling unit 10 and the resistance unit 30.

The insulating frame 50 covers the side surface of the flow path of cooling air from the cooling unit 10 to the resistance unit 30 between the cooling unit 10 and the resistance unit 30. This can prevent the cooling air from leaking from between the cooling unit 10 and the resistance unit 30, and can also enhance the cooling efficiency.

It is also possible to prevent foreign matters such as dust from entering between the cooling unit 10 and the resistance unit 30 from the outside.

The insulating frame 50 can also play a role of a cooling air guide hood provided between the cooling unit 10 and the resistance unit 30.

By forming in a pleated shape on the surface of the outer wall and the inner wall of the side portion constituting the insulating frame 50, it is possible to elongate the insulating distance to enhance the insulating property, compared with a form in which they are not formed in a pleated shape.

In the case where the insulating frame 50 is composed of two or more members, it is possible to form each member more easily, compared with a form in which the insulating frame is configured integrally.

By providing the hole extending in the longitudinal direction of each member constituting the insulating frame 50, such as the through hole 53, the hollow portion is formed inside the insulating frame 50.

This allows the insulating frame 50 to be lightweight as compared with a form in which the hollow portion is not formed.

Fitting allows the insulating frame 50 to be easily assembled from two or more members.

In the present embodiment, an example in which the insulating frame 50 has a substantially rectangular parallelepiped shape penetrating in the vertical direction is shown, but the shape of the insulating frame 50 is not limited thereto.

For example, the insulating frame 50 may have a substantially cylindrical shape penetrating in the vertical direction.

For example, the insulating frame 50 may have a shape in which corners are removed from a rectangular parallelepiped, i.e., a shape in which vertices constituting the rectangular parallelepiped are rounded.

Figure 9:
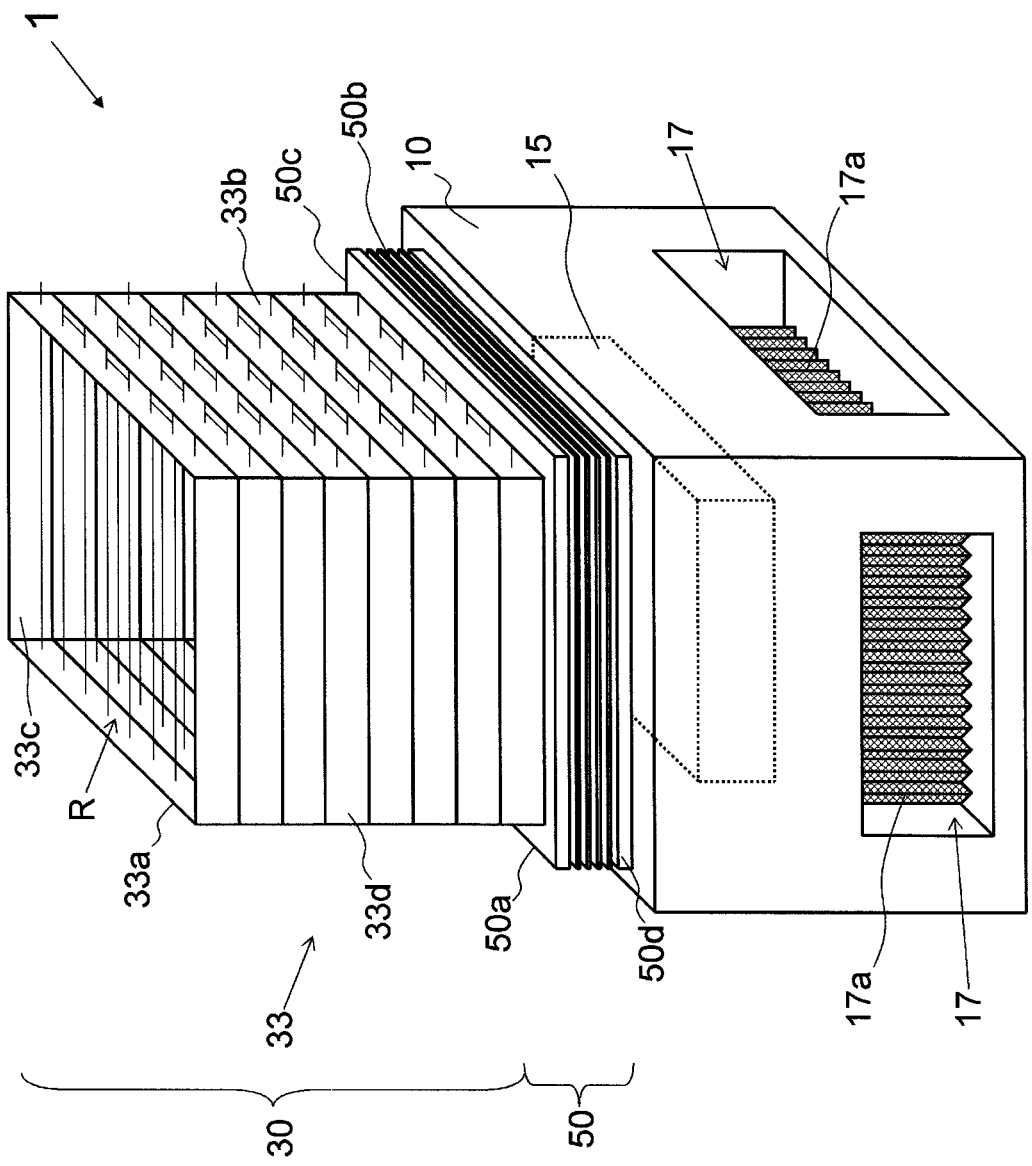
FIG. 9 is a perspective view showing the configuration of the load testing device including an intake port to which an air filter including a pleated filter medium is attached.

An air filter 17*a* may be provided at the intake port 17 (see FIG. 9).

In this case, the air filter 17*a* can prevent impurities from being contained in the air introduced into the cooling fan 15.

The filter medium of the air filter 17*a* may have a planar shape but may also have an uneven shape. As an example of the uneven shape, FIG. 9 shows the air filter 17*a* including a pleated filter medium with repeated mountain folding and valley folding.

Since the surface area is increased due to the uneven shape, it is possible to perform intake while removing more impurities as compared with the air filter 17*a* including a planar filter medium.

Figure 11:
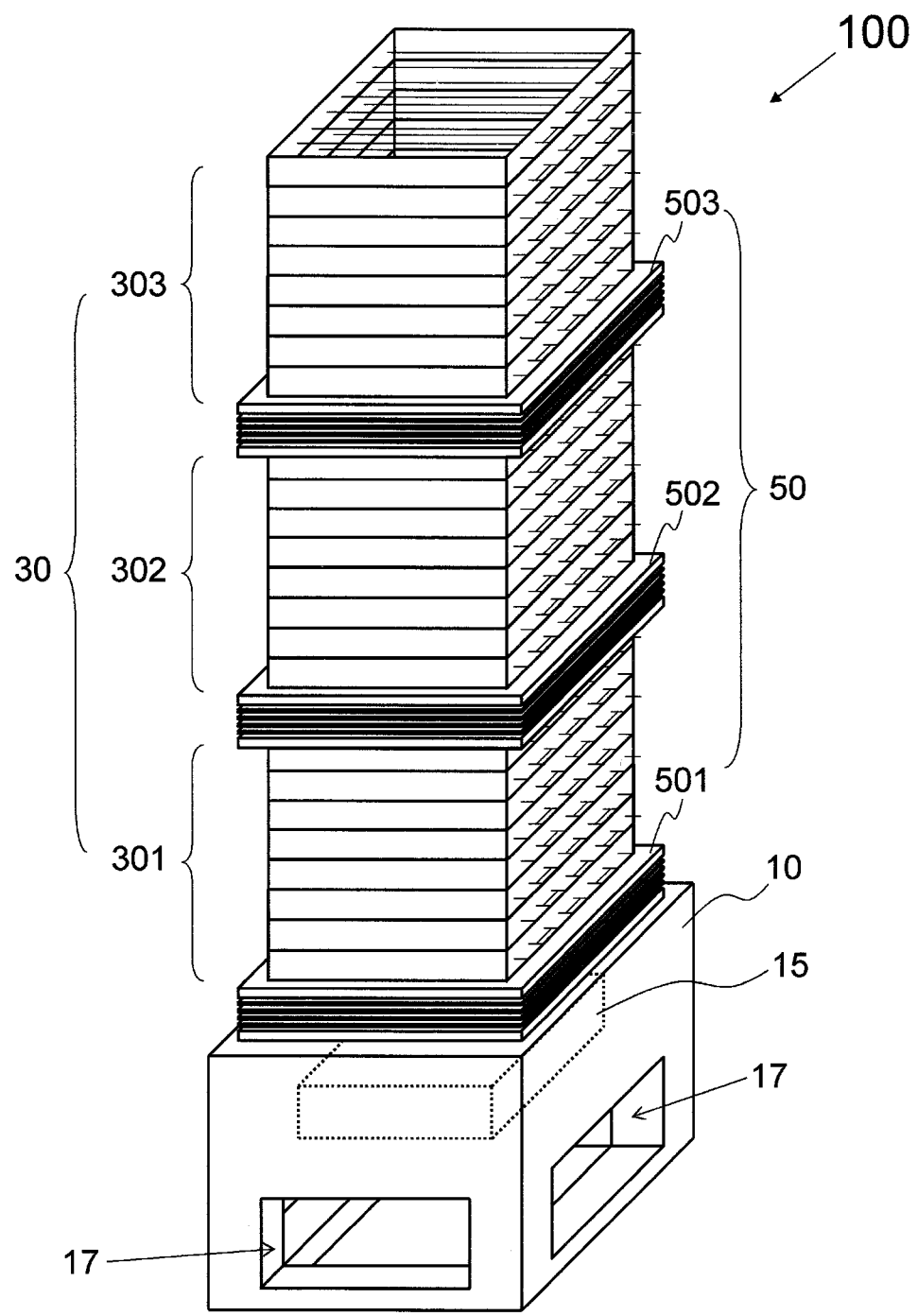
FIG. 11 is a perspective view of the load testing device in which a plurality of resistance units and a plurality of insulating frames are stacked.

In the present embodiment, an example in which the insulating frame 50 is provided between the cooling unit 10 and the resistance unit 30 has been explained, but a load testing device 100 including a plurality of resistance units (U-phase resistance unit 301, V-phase resistance unit 302, and W-phase resistance unit 303) may be provided with an insulating frame between adjacent resistance units (see FIG. 11).

In this case, the resistance unit 30 has a lower U-phase resistance unit (first resistance unit) 301, a middle V-phase resistance unit (second resistance unit) 302, and a upper W-phase resistance unit (third resistance unit) 303, and the insulating frame 50 has a first insulating frame 501, a second insulating frame 502, and a third insulating frame 503.

The U-phase resistance unit 301 has the resistor (first resistor) R and the resistor holding frame (first resistor holding frame) 33.

The V-phase resistance unit 302 is disposed farther above the cooling unit 10 than the U-phase resistance unit 301 is, and has the resistor (second resistor) R and the resistor holding frame (second resistor holding frame) 33.

The W-phase resistance unit 303 is disposed farther above the cooling unit 10 than the V-phase resistance unit 302 is, and has the resistor (third resistor) R and the resistor holding frame (third resistor holding frame) 33.

The first insulating frame 501 is provided between the cooling unit 10 and the U-phase resistance unit 301, the second insulating frame 502 is provided between the U-phase resistance unit 301 and the V-phase resistance unit 302, and the third insulating frame 503 is provided between the V-phase resistance unit 302 and the W-phase resistance unit 303.

The first insulating frame 501 is coupled with the cooling unit 10 on the side near the cooling unit 10 (lower part), and is coupled with the U-phase resistance unit on the side near the U-phase resistance unit 301 (upper part), and covers the side surface of the flow path of cooling air from the cooling unit 10 to the U-phase resistance unit 301 between the cooling unit 10 and the U-phase resistance unit 301.

The second insulating frame 502 is coupled with the U-phase resistance unit 301 on the side near the U-phase resistance unit 301 (lower part), and is coupled with the V-phase resistance unit 302 on the side near the V-phase resistance unit 302 (upper part), and covers the side surface of the flow path of cooling air from the U-phase resistance unit 301 to the V-phase resistance unit 302 between the U-phase resistance unit 301 and the V-phase resistance unit 302.

The third insulating frame 503 is coupled with the V-phase resistance unit 302 on the side near the V-phase resistance unit 302 (lower part), and is coupled with the W-phase resistance unit 303 on the side near the W-phase resistance unit 303 (upper part), and covers the side surface of the flow path of cooling air from the V-phase resistance unit 302 to the W-phase resistance unit 303 between the V-phase resistance unit 302 and the W-phase resistance unit 303.

FIG. 11 shows an example in which the insulating frame (first insulating frame 501) is provided between the cooling unit 10 and the U-phase resistance unit 301, but instead of the first insulating frame 501, an ordinary insulator or the like may be provided.

The second insulating frame 502 and the third insulating frame 503 play a role of insulators normally provided between one resistance unit (e.g., the U-phase resistance unit 301) and another resistance unit (e.g., the V-phase resistance unit 302) adjacent thereto.

Since one insulating frame 50 is provided between one resistance unit and another resistance unit, assembly can be simplified and strength can be enhanced, compared with a form in which a plurality of insulators is provided between one resistance unit and another resistance unit.

The second insulating frame 502 covers the side surface of the flow path of cooling air from the U-phase resistance unit 301 to the V-phase resistance unit 302 between the U-phase resistance unit 301 and the V-phase resistance unit 302.

The third insulating frame 503 covers the side surface of the flow path of cooling air from the V-phase resistance unit 302 to the W-phase resistance unit 303 between the V-phase resistance unit 302 and the W-phase resistance unit 303.

This can prevent the cooling air from leaking from between one resistance unit and another resistance unit, and can also enhance the cooling efficiency.

It is also possible to prevent foreign matters such as dust from entering between one resistance unit and another resistance unit from the outside.

The insulating frame 50 can also play a role of a cooling air guide hood provided between one resistance unit and another resistance unit.

In the present embodiment, an example of the form in which the resistance units 30 are stacked above the cooling unit 10 has been described, but the cooling unit 10 and the resistance unit 30 are disposed in the lateral direction.

Figure 12:
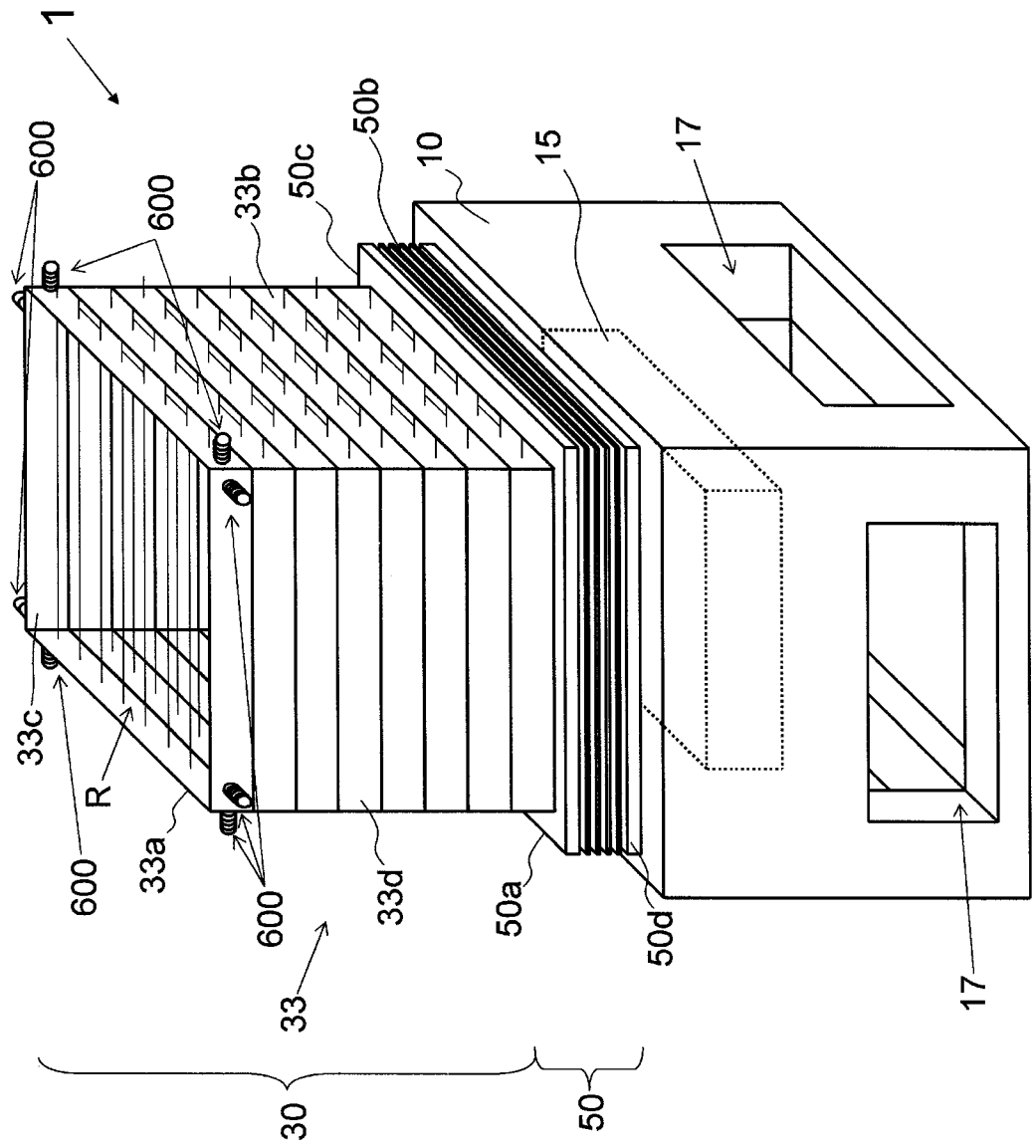
FIG. 12 is a perspective view of the load testing device of FIG. 1 provided with a spacer.

When the cooling unit 10 and the resistance unit 30 are disposed in the lateral direction, it is preferable that a spacer 600 composed of an insulating member and protruding outward from the resistor holding frame 33 is provided (see FIGS. 12 and 13).

Specifically, the spacer 600 is composed of a substantially cylindrical insulator, and extends outward from the side surface constituting the resistor holding frame 33 and, in a direction perpendicular to the side surface.

When the cooling unit 10 and the resistance unit 30 are disposed in the lateral direction, the protrusion amount of the spacer 600 from the resistor holding frame 33 is determined so that the tip of the spacer 600 comes into contact with the outside such as the ground.

When the cooling unit 10 and the resistance unit 30 are disposed in the lateral direction, the tip of the spacer 600 comes into contact with the outside such as the ground, and a space is formed between the resistor holding frame 33 and the outside such as the ground, and between the terminal (portion protruding from the resistor holding frame 33) of the resistor R and said outside.

In the case of not providing the spacer 600, there is a risk that at least one of the resistor holding frame 33 of the resistance unit 30 and the terminal (portion protruding from the resistor holding frame 33) of the resistor R comes into contact with the outside of the load testing device 1 such as the ground. By providing the spacer 600, it is possible to reduce the possibility that the resistor holding frame 33 of the resistance unit 30 and the terminal of the resistor R come into contact with the outside such as the ground.

In the present embodiment, an example in which the resistor holding frame 33 and the terminal of the resistor R are exposed to the outside has been explained, but the frame body 700 that covers the side surface of the resistor holding frame 33 may be provided (see FIG. 14).

In this case, the spacer 600 is provided between the frame body 700 and the resistor holding frame 33.

In a case of not providing the frame body 700, at least one of the resistor holding frame 33 and the terminal of the resistor R is exposed to the outside, and hence there has been a risk that dust or the like adheres to the terminal or the like. By providing the frame body 700, it is possible to reduce the possibility that dust adheres to the resistor holding frame 33 and the terminal of the resistor R.

It is desirable that two or more spacers 600 are provided on each side surface (first front surface portion 33a, first back surface portion 33b, first right side surface portion 33c, and first left side surface portion 33d) of the resistor holding frame 33, but only one spacer 600 may be provided.

In particular, when the frame body 700 is provided, the resistor holding frame 33 and the frame body 700 are fixed via the spacer 600, and hence the stability of the resistor holding frame 33 can be maintained even in a form in which one spacer 600 is provided on each side surface of the resistor holding frame 33.

The spacer 600 may be provided on all of the four side surfaces of the resistor holding frame 33, but it may be provided only on two side surfaces, i.e., one surface facing the outside such as the ground and another surface adjacent to said one surface.

FIG. 14 shows an example in which each of the four side surfaces of the resistor holding frame 33 is provided with one spacer 600.

A mobile rack 800 housing the load testing device 1 including the frame body 700 or the load testing device 1 not including the frame body 700 may be provided (see FIG. 15).

By housing the load testing device 1 into the mobile rack 800, the load testing device 1 can be easily moved to a transport device such as a truck.

Although some embodiments of the present invention have been described, these embodiments are presented by way of example and are not intended to limit the scope of the invention. These embodiments can be implemented in various other forms, and various omissions, substitutions, and changes may be made without departing from the gist of the invention. These embodiments and variations thereof fall within the scope and gist of the invention and fall within the scope of the invention described in the claims and the equivalent scope thereof.

REFERENCE SIGNS LIST

1 Load testing device
10 Cooling unit
15 Cooling fan
17 Intake port
17a Air filter
30 Resistance unit
33 Resistor holding frame
33a First front surface portion
33b First back surface portion
33c First right side surface portion
33d First left side surface portion
50 Insulating frame
50a Second front surface portion
50b Second back surface portion
50c Second right side surface portion
50d Second left side surface portion
51 Mounting hole
53 Through hole
55 Coupler
55a Concave portion
55b Convex portion
61 Mounting bracket
63 Screw
100 Load testing device including plurality of resistance units
301 U-phase resistance unit
302 V-phase resistance unit
303 W-phase resistance unit
501 First insulating frame
502 Second insulating frame
503 Third insulating frame
600 Spacer
700 Frame body
800 Mobile rack
R Resistor

The invention claimed is:

1. A load testing device comprising:
a resistance unit having a resistor and a resistor holding frame holding the resistor;
a cooling unit having a cooling fan; and
an insulating frame disposed between the resistance unit and the cooling unit, wherein
the insulating frame is coupled with the resistance unit,
the insulating frame is coupled with the cooling unit, and
the insulating frame covers a side surface of a flow path of cooling air from the cooling unit to the resistance unit between the cooling unit and the resistance unit.

2. The load testing device according to claim 1, wherein surfaces of an outer wall and an inner wall of the insulating frame are formed in a pleated shape.

3. The load testing device according to claim 1, wherein the insulating frame is composed of two or more members.

4. The load testing device according to claim 3, wherein at least one of two or more members of the insulating frame has a hole extending in a longitudinal direction.

5. The load testing device according to claim 3, wherein two or more members of the insulating frame are coupled by fitting.

6. The load testing device according to claim 1, wherein
in the insulating frame, an intake surface on a side near the cooling unit and an exhaust surface on a side near the resistance unit are open, and the insulating frame has a side portion composed of a front surface portion, a back surface portion, a right side surface portion, and a left side surface portion,
an upper surface of the side portion is coupled to the resistance unit,
a lower surface of the side portion is coupled to the cooling unit, and
surfaces of an outer wall and an inner wall of the side portion are formed in a pleated shape.

7. The load testing device according to claim 1, wherein the insulating frame is mounted on the cooling unit, and the resistance unit is mounted on the insulating frame.

8. The load testing device according to claim 1, wherein an air filter including a pleated filter medium is provided at an intake port of the cooling unit.

9. The load testing device according to claim 1 comprising a spacer composed of an insulating member and protruding outward from a resistor holding frame.

10. The load testing device according to claim 1 comprising:
a frame body covering a side surface of the resistor holding frame; and
a spacer composed of an insulating member between the resistor holding frame and the frame body.

11. The load testing device according to claim 1, wherein the load testing device is housed in a mobile rack.

12. An insulating frame of a load testing device, wherein
the insulating frame is disposed between a resistance unit and a cooling unit, the resistance unit having a resistor and a resistor holding frame that holds the resistor, and the cooling unit having a cooling fan,
the insulating frame is coupled with the resistance unit,
the insulating frame is coupled with the cooling unit, and
the insulating frame covers a side surface of a flow path of cooling air from the cooling unit to the resistance unit between the cooling unit and the resistance unit.

13. A load testing device comprising:
a first resistance unit having a first resistor and a first resistor holding frame that holds the first resistor;
a second resistance unit that is disposed farther from the cooling unit than the first resistance unit is and that has a second resistor and a second resistor holding frame that holds the second resistor;
a cooling unit having a cooling fan; and
an insulating frame which includes at least one of a first insulating frame and a second insulating frame, the first insulating frame being coupled to the first resistance unit, being coupled to the cooling unit, covering a side surface of a flow path of cooling air from the cooling unit to the first resistance unit between the cooling unit and the first resistance unit, and the second insulating frame being coupled to the second resistance unit, being coupled to the first resistance unit, and covering a side surface of a flow path of cooling air from the first resistance unit to the second resistance unit between the first resistance unit and the second resistance unit.

* * * * *